(12) United States Patent
Malik et al.

(10) Patent No.: US 9,400,311 B1
(45) Date of Patent: Jul. 26, 2016

(54) METHOD AND SYSTEM OF COLLECTIVE FAILURE DIAGNOSIS FOR MULTIPLE ELECTRONIC CIRCUITS

(71) Applicant: CADENCE DESIGN SYSTEMS, INC., San Jose, CA (US)

(72) Inventors: Anil Malik, New Delhi (IN); Sameer Chakravarthy Chillarige, Uttar Pradesh (IN); Sharjinder Singh, New Delhi (IN); Joseph Swenton, Owego, NY (US); Gilbert Vandling, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 17 days.

(21) Appl. No.: 14/675,365

(22) Filed: Mar. 31, 2015

(51) Int. Cl.
*G01R 31/28* (2006.01)
*G01R 31/3177* (2006.01)

(52) U.S. Cl.
CPC .................................. *G01R 31/3177* (2013.01)

(58) Field of Classification Search
CPC ..................... G01R 31/31907; G01R 31/31935
USPC ........................................................ 714/735
See application file for complete search history.

(56) References Cited

U.S. PATENT DOCUMENTS

| 4,228,537 A | * | 10/1980 | Henckels | ............... | G06F 11/261 |
| | | | | | 714/33 |
| 4,817,093 A | * | 3/1989 | Jacobs | ............ | G01R 31/318385 |
| | | | | | 714/728 |
| 4,963,824 A | * | 10/1990 | Hsieh | ............. | G01R 31/318544 |
| | | | | | 324/72.5 |
| 6,192,495 B1 | * | 2/2001 | Totorica | ............. | G01R 31/2884 |
| | | | | | 324/762.02 |
| 2007/0100586 A1 | * | 5/2007 | Cheng | ............ | G01R 31/318547 |
| | | | | | 702/185 |

OTHER PUBLICATIONS

J. Waicukauski & E. Lindbloom, "Failure Diagnosis of Structured VLSI", IEEE Design and Test of Computers (Aug. 1989), pp. 49-60.
T. Bartenstein, et al., "Diagnosing Combinational Logic Designs Using the Single Location At-a-Time (SLAT) Paradigm", International Test Conference (2001), Paper 10.4 (pp. 287-296).
D. Appello, et al., "Advances on Yield Learning through Concurrent Evaluation of Design and Process Data", Advanced Semiconductor Manufacturing Conference (2009), pp. 206-210.
R. Desineni, et al., "Hard to Find, Easy to Find Systematics; Just Find Them", International Test Conference (2010), Paper 13.3 (pp. 1-10).
L. Huisman, et al., "Data Mining Integrated Circuit Fails with Fail Commonalities", International Test Conference (2004), Paper 23.2 (pp. 661-668).

(Continued)

*Primary Examiner* — David Ton
(74) *Attorney, Agent, or Firm* — Rosenburg, Klein & Lee

(57) ABSTRACT

In order to detect and locate defects, or faults, in a plurality of chips or other circuits sharing a common design, said chips are each tested for incorrect outputs, or failures, in response to inputs. The incorrect outputs are then collectively diagnosed in a single simulation by simulating a series of suspected fault candidates on a simulated chip of the chip design, and afterward comparing the incorrect outputs generated by each fault candidate to the incorrect outputs of the individual chips, to determine if a fault candidate generates all failures for a chip and no others. The test inputs and expected outputs may be predetermined through Automatic Test Pattern Generation. The fault candidates may be determined by use of a backtrace process such as back cone tracing. The failures may be recorded in association with a measure point, the input pattern that resulted in the failure, and the failure value.

16 Claims, 10 Drawing Sheets

(56) References Cited

OTHER PUBLICATIONS

C. Schuermyer, et al., "Identification of Systematic Yield Limiters in Complex ASICs through Volume Structural Test Fail Data Visualization and Analysis", International Test Conference (2005), Paper 7.1 (pp. 1-9).

H. Tang, et al., "Analyzing Volume Diagnosis Results with Statistical Learning for Yields Improvement", 12th IEEE European Test Symposium (2007).

* cited by examiner

US 9,400,311 B1

METHOD AND SYSTEM OF COLLECTIVE FAILURE DIAGNOSIS FOR MULTIPLE ELECTRONIC CIRCUITS

BACKGROUND OF THE INVENTION

The subject system and method are generally directed to locating defects in chips and other complex electronic components. The system and method generally provide a process to diagnosis the location of the defects for multiple chips in one or more combined processes. In particular, although not exclusively, after incorrect outputs are detected in multiple chips with a common design, the system and method locate the cause of these incorrect outputs by diagnosing a single simulated chip bearing the collective incorrect outputs of the multiple chips, and then distributing this diagnosis among the individual chips.

Integrated circuits ("chips"), circuit boards, printed electronics, and other complex electronic circuits and devices are presently manufactured on a mass scale. (Hereinafter this description will refer to "chips" for convenience, but the principles described herein are also applicable to other circuit implementations unless otherwise specified.) While the processes involved in the manufacture may vary, none are flawless. Therefore, manufacturing testing of the chips is necessary to determine whether defects have arisen.

Because of the small size of circuit lines in modern circuitry, frequently on the nanometer scale, direct examination is not practical. Rather, initial manufacturing testing generally involves providing a chip with a series of inputs, and confirming that the chip produces the proper output in response.

If a fault in a chip is detected, a manufacturer may simply stop and discard the chip. However, this approach is wasteful, and may leave a reparable flaw in the manufacturing process itself undetected, leaving the following manufacturing run vulnerable to the same defects.

Therefore, a manufacturer may instead further diagnose the chip to determine the location of the defect. This may assist in repair of the defect, and in avoidance of similar defects in later manufacturing runs. By evaluating which outputs of a chip have failed and tracing the course of the failures back through the various circuit paths of the chip, then conducting further simulation as necessary, the defect which causes the failure may be located.

However, a complex chip may contain thousands or even millions of paths and points of potential defect, and therefore the complexity of the problem requires considerable time and simulation resources to resolve for each chip. As a manufacturing run may have hundreds or thousands of chips, simulating for each defective chip can be enormously time-consuming. Therefore, although chips may be manufactured in a rapid manner, the testing of these chips creates a bottleneck in the ability of a manufacturer to confirm whether they are ready for the consumer.

There is therefore a need for a more efficient testing procedure, which may determine the location of a defect in one or more chips more quickly.

SUMMARY OF THE INVENTION

While not limited thereto, a disclosed embodiment is directed to a method of detecting and diagnosing failures and faults in a plurality of chips implementing a common design. The method may comprise, for each chip in the plurality of chips, supplying one or more input patterns of one or more inputs predetermined under a testing scheme predetermined for the common design of the plurality of chips, the testing scheme including an expected output pattern of one or more expected outputs for each input pattern, for each supplied input pattern, capturing a resulting output pattern and comparing the resulting output pattern with the expected output pattern, and for each resulting output pattern that does not match the expected output pattern, recording one or more real failures, each real failure representing at least one unexpected output of the resulting output pattern and recorded in association with the chip and the input pattern. The method may further comprise generating a simulated chip model having the common design of the plurality of chips; running a simulation, using the simulated chip model, in which the one or more input patterns are applied in the simulation to each of a plurality of simulated faults, and each simulated unexpected output pattern resulting from a simulated input pattern and a simulated fault is recorded as one or more simulated failures, each simulated failure representing at least one unexpected output of the simulated unexpected output pattern and recorded in association with the simulated input pattern and the simulated fault; and for each simulated fault, compiling a simulation report including all simulated failures associated with the simulated fault. The method may further comprise, for each chip in the plurality of chips, compiling a chip failure report including all real failures associated with the chip, for each simulated fault, comparing the real failures of the chip failure report to the simulated failures of the simulation report of the simulated fault, and generating a chip diagnosis report including at least one result of the comparison. The method may further comprise, before generating the simulated chip model, organizing the plurality of chips into one or more groups of chips, each chip group formed based on a commonality of failures.

According to an aspect of the disclosed method, at least one of the one or more input patterns applied in the simulation may be a supplied input pattern for which the resulting output pattern matched the expected output pattern for all chips in the plurality of chips.

According to an aspect of the disclosed method, each chip diagnosis report may include all simulated faults for which a set of all simulated failures of the simulation report of the simulated fault matches a set of all real failures of the chip failure report. Alternatively, each chip diagnosis report may include all simulated faults for which a set of all simulated failures of the simulation report of the simulated fault form a subset of a set of all real failures of the chip failure report.

According to an aspect of the disclosed method, each real failure may represent exactly one unexpected output of the resulting output pattern, and all unexpected outputs of each non-matching resulting output pattern are so recorded, and each simulated failure may represent exactly one simulated unexpected output, and all simulated unexpected outputs are so recorded.

According to an aspect of the disclosed method, each of the plurality of simulated faults may be determined by conducting a back cone trace according to one of the unexpected outputs of the one or more recorded real failures.

According to an aspect of the disclosed method, for each resulting output pattern that does not match the expected output pattern, one real failure may be recorded for each unexpected output of the resulting output pattern, and each real or simulated failure associated with a combination of measure point and input pattern which is unique among all real or simulated failures may be assigned a unique failure index. Additionally, a data representation of the simulation report may include an array of failure bits, each failure bit having a bit index, and each failure bit may be set to a bit value of 1 if and only if the simulated failure having the failure index corresponding to the bit index of the failure bit is associated with the simulated fault.

Any of these methods, and others, may be encoded on a non-transitory computer readable medium, as executable processing instructions for implementing said methods using one or more processors.

While not limited thereto, another disclosed embodiment is directed to a failure diagnosis system for chips. The system may comprise a chip failure detection device which may include a chip receptacle, one or more processors, and one or more data storage units, the chip receptacle having input and output connectors. The one or more processors may be configured to supply one or more input patterns of one or more inputs through the input connector to a chip installed in the chip receptacle, the one or more input patterns predetermined under a testing scheme for the chip design of the chip, the testing scheme including an expected output pattern of one or more outputs for each input pattern, the testing scheme stored in one of the one or more data storage units. The one or more processors may be further configured to, for each supplied input pattern, capture a resulting output pattern from the output connector of the chip receptacle and compare it with the expected output pattern. The one or more processors may be further configured to, for each resulting output pattern that does not match the expected output pattern, recording one or more real failures to one of the one or more data storage units, each real failure representing at least one unexpected output of the resulting output pattern and recorded in association with the chip and the input pattern. The system may further comprise a chip modeling module configured to generate a simulated chip model having a predetermined chip design. The system may further comprise a chip modeling module configured to receive, from the chip modeling module, the simulated chip model, run a simulation, using the simulated chip model, in which one or more input patterns are applied in the simulation to each of a plurality of simulated faults, and record each simulated unexpected output resulting from a simulated input pattern and a simulated fault as a simulated failure, in association with the simulated input pattern and the simulated fault. The system may further comprise a chip reporting module configured to receive, from the chip simulation module, the set of recorded simulated failures, receive one or more chip failure reports, each chip failure report identifying a chip presently or previously installed in the chip receptacle, and a set of failures associated with said chip, for each simulated fault, comparing the real failures of the chip failure report to the simulated failures of the simulation report of the simulated fault, and generate a chip diagnosis report including at least one result of the comparison.

According to an aspect of the disclosed system, the chip failure report may be compiled by the one or more processors and includes all real failures associated with the chip identified in the chip failure report. Additionally, the chip reporting module may receive the one or more chip failure reports from the chip fault detection device. Alternatively, the chip modeling module may receive the one or more chip failure reports from the chip fault detection device, and the chip reporting module may receive the one or more chip failure reports from the chip fault detection device.

According to an aspect of the disclosed system, each of the plurality of simulated faults may be determined by the chip modeling module conducting a back cone trace according to one of the recorded real failures. Alternatively, each of the plurality of simulated faults may be determined by the chip simulation module conducting a back cone trace according to one of the recorded real failures.

According to an aspect of the disclosed system, the chip modeling module, the chip simulation module, and the chip reporting module may be encoded as software on the data storage units and executed on the one or more processors.

Additional aspects, details, and advantages of the disclosed system and method will be set forth, in part, in the description and figures which follow.

DETAILED DESCRIPTION OF THE PREFERRED EMBODIMENTS

Figure 1A:
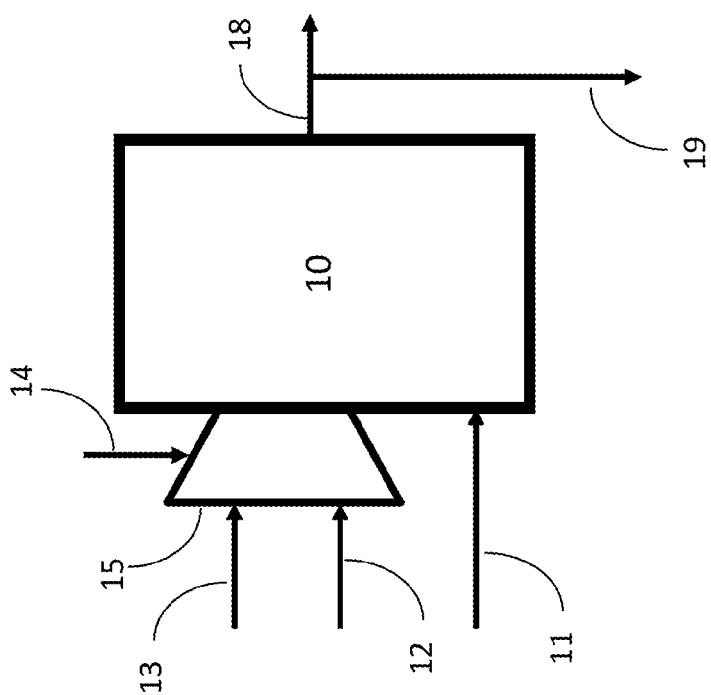
FIG. 1A is a circuit diagram depicting a normal flop and a scan flop.
Figure 1A:
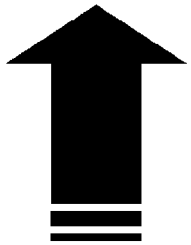
Figure 1A:
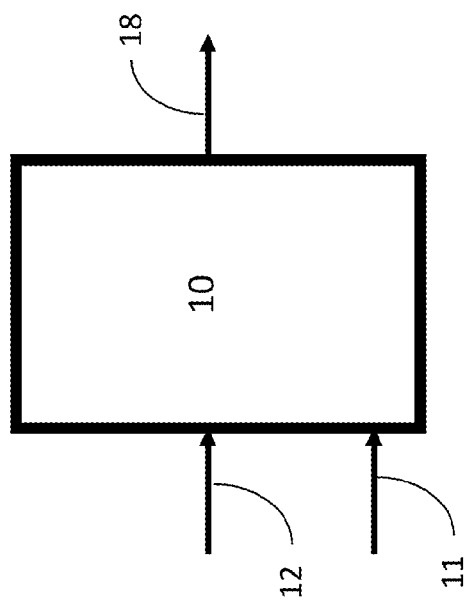

Reference will now be made in detail to exemplary embodiments, which are illustrated in view of the accompanying drawings, wherein like reference numerals refer to the like elements throughout. The embodiments are described below in order to explain the disclosed system and method by referring to the figures.

As previously noted, the term "chips" should be interpreted to include not only integrated circuits but also circuit boards, printed electronics, and other complex electronic circuits, whether within larger devices or alone, as the principles herein are applicable to all of these.

Manufacturing Defects and Testing Generally

Defects, also called faults, can be anything that may affect the structural or functional behavior of chips. Defects can occur anywhere in a chip's logic and can be the result of numerous types of errors which can occur during the manufacturing process. For example, a chip may have a broken line, which can result in a "stuck-at-0" fault; that is, the broken line is always "off" even when it should not be. A chip may have a short due to buckled lines or contamination, which can, if connecting a regular line to a power source line, result in a "stuck-at-1" fault; that is, the regular line is always "on" even when it should not be.

A chip may also have a malformed line, resulting in a transition fault; that is, the malformed line fails to switch to "on" or "off" at the speed expected. Transition faults can also occur due to a conductive contamination not being sufficient to actually short-circuit the line but serving to increase the load. Still more types of faults, such as bridging faults and transistor faults, also exist and are known in the field. However, for reasons of convenience, the examples described herein will focus illustratively on stuck-at faults.

A helpful feature in testing for defects in a chip is a scan flop configuration, comprising one or more scan flops (sometimes called D-flops). FIG. 1A depicts a normal flop and its conversion to a scan flop, according to an embodiment of the invention.

As depicted in FIG. 1A, a normal flop 10 receives a clock signal on a clock line 11, and an input data signal on an input data line 12. The flop 10 then outputs an output data signal on an output data line 18 according to the clock signal and input data signal. Numerous possible internal configurations of flops are well known in the art and will not be repeated here. A chip may have numerous such flops as part of its basic design.

To convert flop 10 to a scan flop, a multiplexer 15 is inserted between the input data line 12 and the flop 10. The multiplexer 15 also receives a scan-in signal on a scan-in line 13, and a scan-enable signal on a scan-enable line 14. Depending on whether the scan-enable signal has a bit value of '1' or '0', the multiplexer 15 either allows the input data signal on the input data line 12 through to the flop 10 while ignoring the scan-in signal on the scan-in line 13, or vice versa. The internal configuration of the flop 10 remains unaltered, so the flop 10 treats the scan-in signal like it would the input data signal, generating an output data signal on output data line 18 accordingly. In such a manner, input values may be delivered more directly to the flop 10 along the scan-in line 13, bypassing logic leading up to the input data line 12.

Optionally, a scan-out line 19 may be added to branch from output data line 18. The output data signal will not only continue on the output data line 18 to any following logic, but exit the chip more directly through the scan-out line 19, allowing the signal to be read and recorded at a point before it continues through the chip logic to the standard output points. A scan-out line 19 may be attached to the output data line 18 of all scan flops (that is, all flops that include a multiplexer 15 and related lines) or merely some of them, and may also be added to other data lines in the chip as desirable.

In a preferred embodiment, all flops in the chip design are converted to scan flops. They may then be connected to form scan chains (shift registers) which will help a tester apply data values directly into the chip's logic.

Figure 1B:
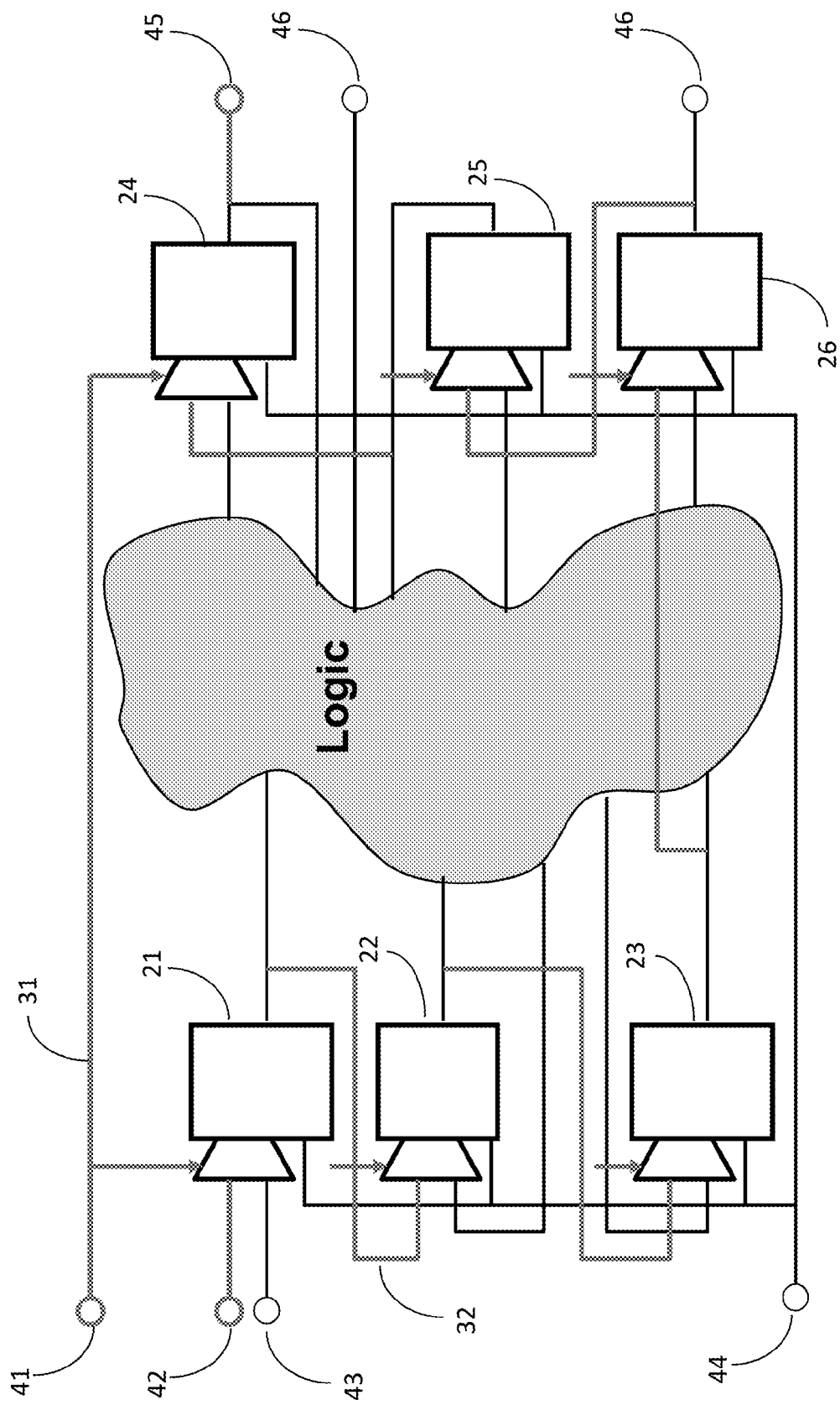
FIG. 1B is a circuit diagram depicting an example chip design including a scan chain.

For purposes of explanation, an example chip design, which is depicted in FIG. 1B, will now be described which includes such a scan chain. Those of skill in the art will be able to expand the principles described below to apply to a wide variety of chip designs.

As depicted, all scan flops 21-26 may be connected to the same scan-enable line 31, which receives the signal from a scan-enable pin 41. Other input pins may include one or more scan-in pins 42, one or more data input pins 43, and a clock pin 44. Output pins may include a scan-out pin 45 and one or more data output pins 46.

As depicted, the scan-out line (line 32) of scan flop 21 becomes the scan-in line of scan flop 22. The remaining scan flops 22-26 are similarly connected in a daisy-chain, forming a scan chain configuration which may bypass part or all of the chip's logic.

The scan-enable signal on scan-enable line 31 defines and controls two modes, depending on the bit value of the scan-enable signal. In a shift mode, the flops are connected and operate in a configuration of a shift register, and signals can be loaded from the scan-in pin 42 to stimulate the logic to required values. The same mode can be used to unload values from the scan-out pin 45 once the functionality of the logic has been tested. In a capture mode, the flop captures data from logic behind the flops, thus testing any logic present in its back cone.

Figure 1C:
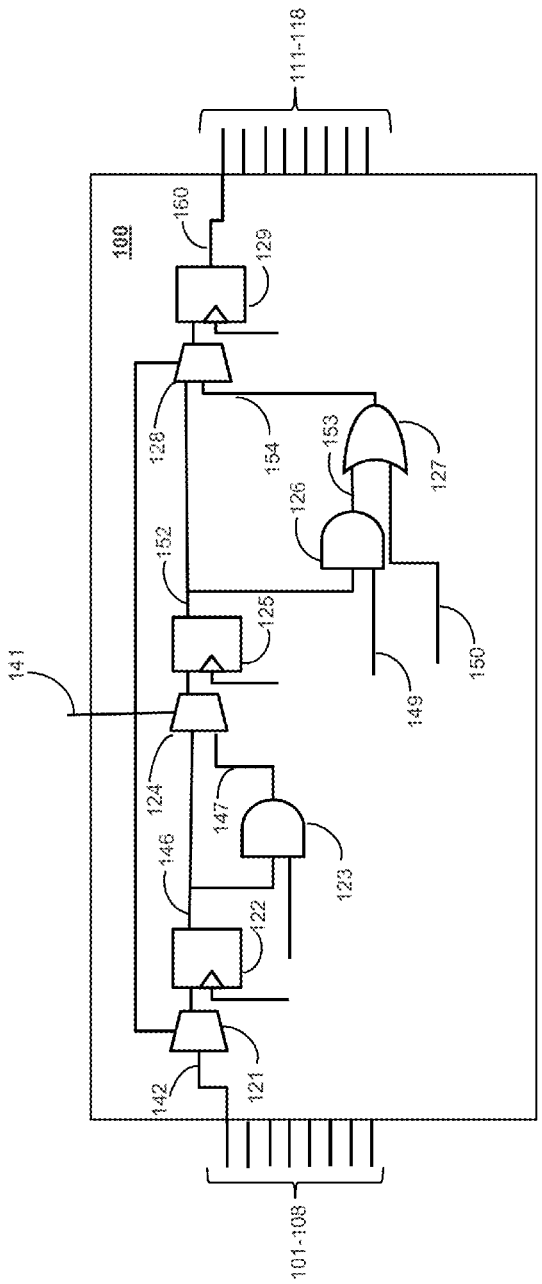
FIG. 1C is a circuit diagram depicting another example chip design.

For purposes of explanation, another example chip design, which is depicted in FIG. 1C, will now be described, and will be used in the description of the exemplary testing processes that follow. Those of skill in the art will be able to expand the principles described below to apply to a wide variety of chip designs.

As depicted in FIG. 1C, a chip includes standard input pins 101-108 and standard output pins 111-118. A scan-enable line 141 also has its own input pin. As depicted, input pin 101 also serves as a scan-in pin and output pin 111 serves as a scan-out pin, although in other chip designs both the scan-in and scan-out pins may be separated from the standard input and output pins, as the scan-enable pin is depicted.

Components within the depicted chip include three multiplexers 121, 124, and 128, each converting one of three flops 122, 125, and 129 to scan flops; two AND gates 123 and 126; and an OR gate 127. Scan flops 122, 125, 129, and output pins 111-118 are known as measure points because values at these points can be read and recorded.

The scan flops can operate in capture mode and shift mode, dependent on the signal on scan-enable line 141. In shift mode, all three scan flops 122, 125, 129 work together and act as a shift register, and prior logic gates 123, 126, 127 are cut off from the scan flops as multiplexers 121, 124, 128 switch off the lines 147 and 154. Thus all scan flops are directly connected to each other through lines 142, 146, 152, and 160. In capture mode, the scan flops 122, 125, 129 can capture the output of logic gates through lines 147, 154. These then can be shifted out through output pin 111 in shift mode using the scan enable line 141.

To keep the description of the chip and its operation simple, other details of the chip's components and their arrangement, including the destination of other input points and the source of other output points, are left as a black box.

As can be seen in FIGS. 1B and 1C, the use of scan flops allows a chip with dense logic to be more controllable and observable, by permitting input to and output from points within the chip.

In specific manufactured instances of the example chip design of FIG. 1C, defects may develop in the chip at numerous locations. As one example, one chip may have a stuck-to-0 fault on line 153. AND gate 126 will then persistently output a 0 on line 153 regardless of the input of either incoming line (that is, either line 149 or line 152), in turn potentially affecting the output of OR gate 127 on line 154 and any gates that receive input from line 154. If another chip has a stuck-to-1 fault on either line 150 or line 153, OR gate 127 will persistently output a 1 on line 154, regardless of any intended input from either line.

A manufacturing test may have a detection stage, where a chip is checked to determine whether one or more defects exist, and a diagnosis stage, where the location and cause of the one or more defects is determined. (If no defect is detected in a particular chip during the detection stage, the diagnosis stage can be skipped for that chip.)

The detection stage of a manufacturing test can be performed via a structural approach. A structural-style test methodically checks each gate and each connection in a chip at least once by supplying pre-determined inputs. As the design of the chip is known and constant across all chips, each input or set of inputs should produce one or more expected outputs; if the actual output on the tester does not match the expected output, the chip has one or more defects. That is, when test patterns are applied to a defective chip, some outputs will be altered from expectations, and a testing device may observe these alterations and record them as failures. (The manufacturing test assumes that the design itself is correct and would produce the expected output if no faults had been introduced during manufacturing.) This approach is indifferent to the desired function of the chip, but confirms that the chip produces the expected output in all cases and is therefore correctly manufactured.

More complex patterns may also include specific timing of the individual input signals and/or expected output signals, among other features.

Thus, each input pattern includes a set of inputs to the standard input pins and/or scan-in pins, with a corresponding expected output pattern which includes a set of expected outputs from the standard output points and/or scan-out pins.

An effective structural set of test patterns (that is, input patterns and corresponding expected output patterns) will be such that the set of test patterns will test all components of a chip design. These patterns need to be generated only once and can then be applied to all manufactured instances of a given chip design. Such a test pattern set may be generated using Automatic Test Pattern Generation (ATPG). Multiple ATPG algorithms are known in the field; the more extensively used include D-Algorithm, Path Oriented DEcision Making (PODEM) Algorithm, and FAN Algorithm, each of which are incorporated herein by reference.

The recorded failures are then gathered for input to a diagnostics tool. The diagnosis stage is preferably performed not on the chip itself but on a simulation of the chip conducted by the diagnostics tool, based on the known design of the chip.

The diagnosis stage can be divided into two steps. In a first step, the diagnosis may employ a backtrace process, such as logic back cone tracing (also called simply "back cone tracing"). In back cone tracing, the number of possible faults to simulate is pruned by tracing back the logic from the locations where failures are observed. This reduces the number of faults which require fault simulation in the second step. By calculating the failures of each selected fault and matching them to the failures observed on the tester, it is possible to identify the defect location. Once the number of possible faults are reduced, the remaining possible faults are simulated in a second step, and thereby matched to the failures observed on the tester to determine the actual location of the default.

An example of pattern testing, followed by back cone tracing, will now be described with further reference to the example chip design depicted in FIG. 1C. Assume that an input pattern supplies positive input signals (that is, a bit value '1') at input pins 101, 105, and 106, and the corresponding expected output pattern consists of positive output signals at output points 111 and 118. To supply the input pattern to the internal measure points (scan flop 122, 125, 129) the three input pattern values (logic bit value '1') are shifted through scan-in line 142 during shift mode. Now scan flop 125 has logic bit value '1'. Note that, due to use of the shift mode, all logic prior to scan flop 125 (such as AND gate 123), including any defects in said logic, have been bypassed.

Capture mode is then engaged using the scan-enable line 141. Scan flop 125 still has logic bit value '1' which is output to line 152. Through similar operations, bit value '1' is applied to line 149, and bit value '0' to line 150. The AND gate 126 therefore has bit value '1' at both its input lines and should output bit value '1' to line 153. However, in a particular chip, there is a stuck-at-0 fault on line 153, which applies a bit value '0' to the OR gate 127. As noted, bit value '0' is also applied to line 150, and therefore OR gate 127 receives two '0' values and outputs a bit value '0' to line 154, which is then captured on scan flop 129.

If there were no fault present on line 153, the expected value bit '1' would have been captured on scan flop 129. Because the captured value was instead a '0', a failure has occurred under the testing pattern. This failure is recorded in the form of I/O (expected value/measured value) at scan flop 129, which as noted is a measure point. The captured value on scan flop 129 is then shifted out through scan-out line 160 in shift mode.

Based on this captured failure, a back cone trace is conducted working backward from measure point 129, where the failure was captured, and results in a selection of possible fault candidates on lines 149, 150, 152, 153, and 154. That is, faults on any of these lines could result in an unexpected value at measure point 129.

As shown above, use of scan-in and scan-out features may narrow the possible sources of a fault considerably, by eliminating as possible fault candidates any lines or logic prior to a scan-in point for the purposes of the back cone trace. In some cases, the input and output test patterns may therefore use these features directly, by including direct input to, for instance, scan flop 125 in an input pattern, or measuring direct output of, for instance, scan flop 125 in an output pattern.

However, it is noted that scan-in and scan-out features are not a requirement of the present invention. Additionally, scan-in and scan-out features may be implemented without use of scan flops, instead using other components or configurations. Indeed, a back cone trace itself is not a requirement of the invention either.

With the back cone tracing complete, in a second step of the diagnosis process, the possible fault candidates may then be further simulated to determine if they match the defect's behavior. Failures caused by each simulated fault are stored in memory. Each set of failures are matched to the failures observed on the tester. The fault which best matches the defect behavior on the chip is the defect location.

Multiple Device Diagnosis

For a complex chip, a simulation conducted using prior art methods can require several minutes per chip simulated, using present-day hardware; this includes the time required to initialize the simulation, as well the processing time required to simulate even one fault. While average processing power can be expected to increase in the future, it will do so in part through even more complex chips becoming the norm, thus suggesting that this problem will remain indefinitely if left to itself. It is therefore desirable instead to increase efficiency, for instance by reducing the number of necessary simulations.

Figure 2:
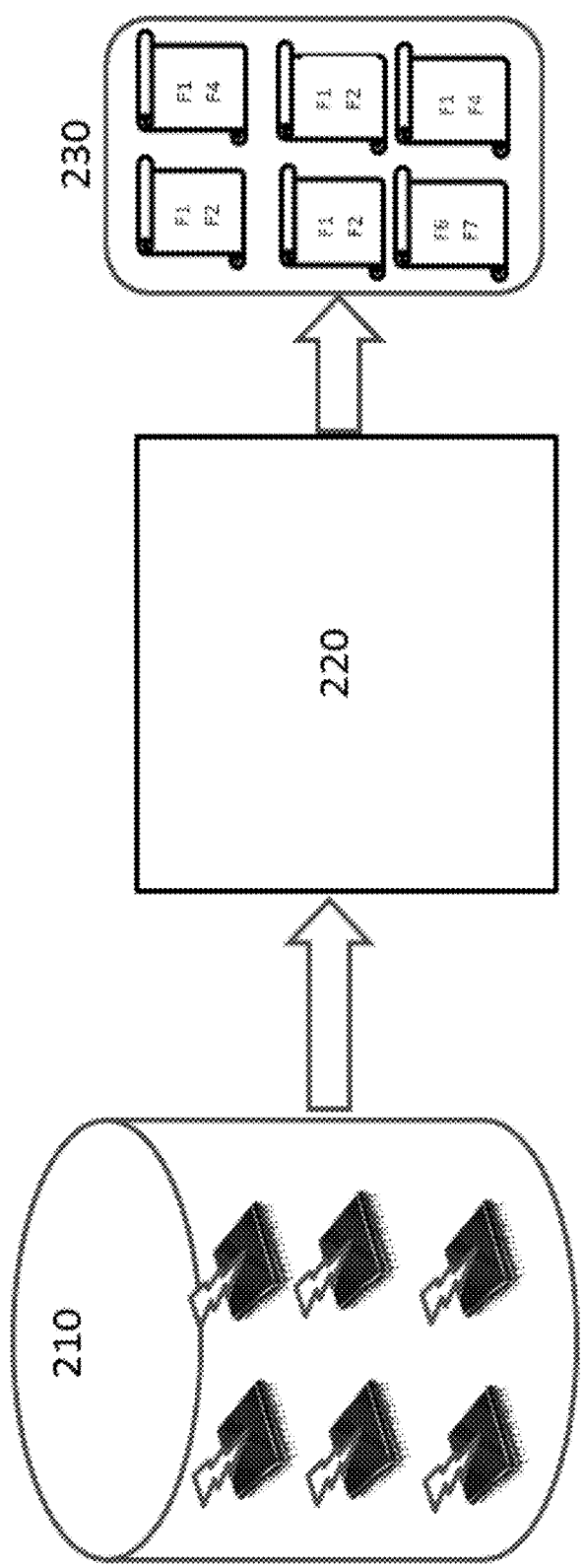
FIG. 2 is an illustrative diagram depicting a method for diagnosing failures in a plurality of chips.

FIG. 2 is an illustrative diagram of a method for diagnosing failures in a plurality of chips, formed according to an exemplary embodiment of the present invention. Each chip in a plurality of chips 210 implementing a common chip design has been determined to fail during a failure detection stage. Rather than diagnose them individually, a chip simulator 220 may diagnose a smaller number of simulated chips, where at least one of the simulated chips bears the failures of more than one chip. The diagnoses for each failure are then redistributed among the plurality of chips as a series of chip diagnosis reports 230, each report corresponding to a chip and containing diagnoses for the failures detected in the corresponding chip.

As an example, assume that five chips implementing the chip design of FIG. 1 have all been determined to fail during the detection stage, each according to the following chip failure table:

TABLE 1

|  | Pattern 1 | Pattern 2 | Pattern 3 | Pattern 4 |
|---|---|---|---|---|
| Chip A | 111, 113, 125 | Pass | 113, 115, 116 | Pass |
| Chip B | 111, 113, 125 | Pass | Pass | 113 |
| Chip C | 111, 113, 125 | Pass | 113, 115, 116 | Pass |
| Chip D | Pass | Pass | Pass | Pass |
| Chip E | Pass | 118 | Pass | Pass |

In Table 1, each row represents a chip instance, and each column represents a test pattern. Failures are described by the measure points which provided incorrect outputs. That is, each incorrect measure point listed for a given pattern represents a failure.

In a single chip diagnosis process, all possible fault candidates are selected which could match the failure behavior of a given chip instance (say chip A), using for instance the back cone trace process described earlier herein. The behavior of a given fault candidate is generated by performing simulation on that fault candidate. However, each such fault candidate must be tested for chip A before any can be determined to be the actual source of the failure.

A multiple device diagnosis process, however, relies on the principle that the behavior of a fault under an input or input pattern is constant, and these results can be applied to any future failure data.

As a simple example, in the above example, Chip A and Chip C pass or fail all the patterns in the same manner. A diagnosis stage, therefore, may treat the two chips as if they were the same chip, diagnosing Chip A and then supplying the same diagnosis for Chip C without repeating the simulation.

Furthermore, Chip A and Chip B both fail Pattern 1 in the same manner, although their outputs for other patterns differ. A diagnosis stage, therefore, may simulate Chip A's failure of Pattern 1, and then apply the resulting diagnosis directly to Chip B rather than diagnose Chip B's failure of Pattern 1 separately.

This principle may be expanded yet further. That is, rather than diagnosing each failure of each chip individually, the chip simulator may treat them as one or more simulated chips where at least one simulated chip bears the failures of multiple chips. Preferably, the simulator treats the multiple chips as a single simulated chip which collectively incorporates all failures, and by extension all faults of all of the chips. The diagnosis for each individual failure is then properly assigned to each chip that has said failure.

For example, the exemplary Chips A-E in Table 1 above would be combined into a Simulated Chip S with the following list of failures, which have been OR-merged from all failures recorded for the individual chips:

TABLE 2

|  | Pattern 1 | Pattern 2 | Pattern 3 | Pattern 4 |
|---|---|---|---|---|
| Chip S | 111, 113, 125 | 118 | 113, 115, 116 | 113 |

(As Chip D does not fail any of the patterns, it requires no diagnosis, and may be dropped from this process at any point.)

This information may be further organized and indexed as a series of failures, each failure uniquely represented by a numerical index, where the content of the failure is the input pattern and a single failed output resulting therefrom. Each failure is also associated with all chip instances that suffered said failure.

TABLE 3

| Failure Index | Failure Content | Chips Affected |
|---|---|---|
| Failure 1 | Pattern 1 -> 111 | Chip A, Chip B, Chip C |
| Failure 2 | Pattern 1 -> 113 | Chip A, Chip B, Chip C |
| Failure 3 | Pattern 1 -> 125 | Chip A, Chip B, Chip C |
| Failure 4 | Pattern 2 -> 118 | Chip E |
| Failure 5 | Pattern 3 -> 113 | Chip A, Chip C |
| Failure 6 | Pattern 3 -> 115 | Chip A, Chip C |
| Failure 7 | Pattern 3 -> 116 | Chip A, Chip C |
| Failure 8 | Pattern 4 -> 113 | Chip B |

A fault is a structural defect on a particular logic gate instance location or any electronic component present in the chip, and may be represented by one or more failures that the fault may cause. Each fault may also be uniquely represented by a numerical index. A fault candidate is one of one or more faults that, if present in a given chip design, would cause an associated failure.

Possible fault candidates are selected using any fault selection technique (commonly but not necessarily back cone tracing, which is described in more detail above, or another backtrace process). The fault candidates are then each simulated in a chip simulator and the failure behavior of each fault in response to one or more input patterns is recorded. A sample result of such simulated behavior across all input patterns is given below.

TABLE 4

|  | Pattern 1 | Pattern 2 | Pattern 3 | Pattern 4 |
|---|---|---|---|---|
| Fault 1 | 111 | Pass | 113, 116 | 113 |
| Fault 2 | 111, 113, 125 | Pass | 113, 115, 116 | Pass |
| Fault 3 | 111, 113, 125 | Pass | Pass | 113 |
| Fault 4 | 111, 113 | Pass | 115, 116 | Pass |
| Fault 5 | Pass | 118 | Pass | Pass |

As given in Tables 1 and 4, the failure behavior of Fault 2 matches the failure data of Chip A and Chip C, Thus Chip A and Chip C may be determined to have failed due to Fault 2. Similarly Fault 3's behavior matches Chip B's failure data, and Fault 5's behavior matches Chip E's failure data. The Fault 1 and Fault 4 behaviors do not match any chip's failure data and thus would not be a likely cause of the failures in any of the chips.

Table 4's data organization is preferable if there is only one defect in the chip instance. However, in case of multiple faults present in a single chip instance, the failure behavior of a fault may match partially but not completely with the chip's failure data. In this case, further post-simulation analysis of a chip instance may identify the possible set of defects, which could match the chip instance failure data. The post-processing analysis of multiple defects in a single chip instance is not essential to this invention and will not be described in detail.

Figure 7A:
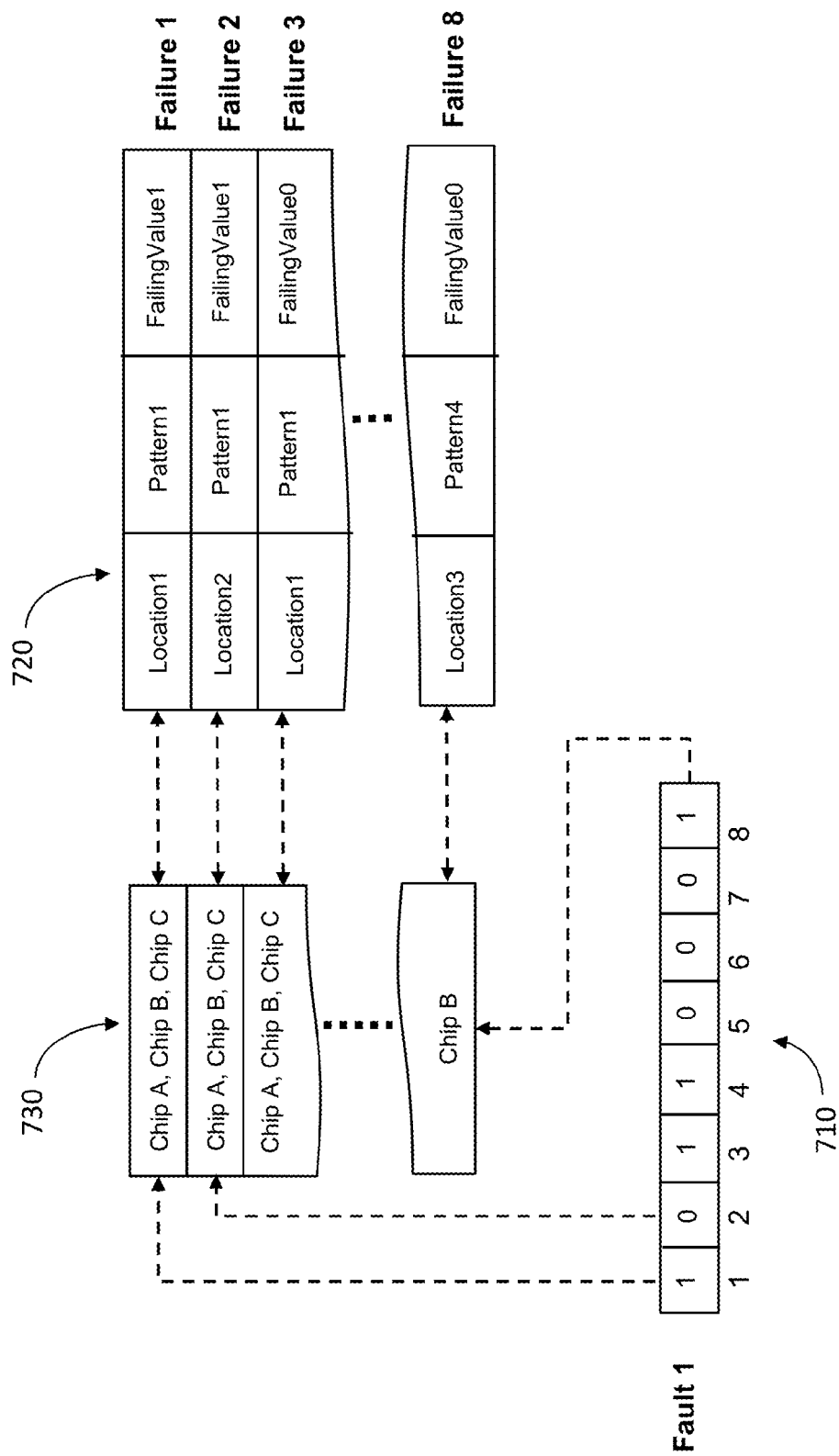
FIG. 7A is an illustrative diagram depicting a data arrangement.

FIG. 7A depicts a possible data arrangement which may represent the above information.

As depicted, for each fault candidate tested during simulation, for instance Fault 1, a bit array 710 is created, with one bit location for each indexed failure. Each bit location, or index, of bit array 710 is associated with an indexed failure in a list of failures 720, as well as a set of chips which recorded that failure in a list of affected chip sets 730. The list of failures 720 may include the measure point where the failure occurred, and the input pattern which resulted in the failure. The list of failures 720 may also note the value of the failure (e.g. a bit value '1' when a bit value '0' was expected, or vice versa), although in some embodiments this may instead be deduced later from the expected output value for that location and input pattern.

A value of '1' or '0' can be stored in each bit location in the bit array 710 for a given fault candidate, for instance Fault 1. A value of '1' in a bit location indicates that Fault 1 can cause the failure associated with that bit location, while a value of '0' indicates that Fault 1 cannot cause the failure.

For each fault candidate simulated, a bit array 710 as depicted above will be saved. Each bit array 710 thereby stores the failure behavior of a fault candidate to compare with the individual failing chips.

In the above example, bit array 710 represents eight failures that belong to four different failing chips: Chip A, Chip B, Chip C, and Chip E. The first bit location, or index, corresponds to Failure 1 which affects failing Chips A, B, and C. Fault 1 has been shown to cause Failure 1, therefore the first bit location contains a "1" bit value. The second bit location corresponds to Failure 2 which also affects failing Chips A, B, and C. Fault 1 has not been shown to cause Failure 2, therefore the first bit location contains a '0' bit value. (Note that this means Fault 1 cannot explain all failures in any of Chips A, B, or C, as all three suffer from Failure 2.)

In summary, every index in bit array 710 has a one-to-one relation with a failure and may have a "one-to-many" relation with the failing chips.

As the behavior of a fault under an input pattern is constant and these results can be compared to any failure data, the failure behavior of individual faults for a given chip instance may be generated. For example, Table 1 and Table 3 may be combined to generate the following table for Chip A (where "MF" means Matched Failures and "EF" means Extra Failures that are not present in the failure data of chip A).

TABLE 5

|  | Pattern 1 |  | Pattern 2 |  | Pattern 3 |  | Pattern 4 |  |
| --- | --- | --- | --- | --- | --- | --- | --- | --- |
|  | MF | EF | MF | EF | MF | EF | MF | EF |
| Fault 1 | 111 |  |  |  | 113, 116 |  |  |  |
| Fault 2 | 111, 113, 125 |  |  |  | 113, 115, 116 |  |  |  |
| Fault 3 | 111, 113, 125 |  |  |  | 113, 115, 116 |  | 113 |  |
| Fault 4 | 111, 113, 125 |  |  |  | 115, 116 |  |  |  |
| Fault 5 |  |  |  | 118 | 115, 116 |  |  |  |

A table can also be derived from Table 1 to show Chip A's failure data:

TABLE 6

|  | Pattern 1 | Pattern 2 | Pattern 3 | Pattern 4 |
| --- | --- | --- | --- | --- |
| Chip A | 111, 113, 125 |  | 113, 115, 116 |  |

Comparing Table 5 and Table 6 reveals that Fault 2's behavior exactly matches Chip A's failure data, while Fault 1 and Fault 4 partially match. Fault 3 and Fault 5 produces an extra failure in Pattern 2 and Pattern 4, respectively, and cannot even be a partial cause of Chip A's failure data. So by comparing Table 5 and Table 6, one may conclude that Chip A most likely failed due to the Fault 2 defect. In a similar manner, one can reconstruct the failure behavior in Table 5's format for each fault candidate and chip instance, and match the failure data of each chip instance to determine the most likely fault candidate for the given chip instance.

Figure 7B:
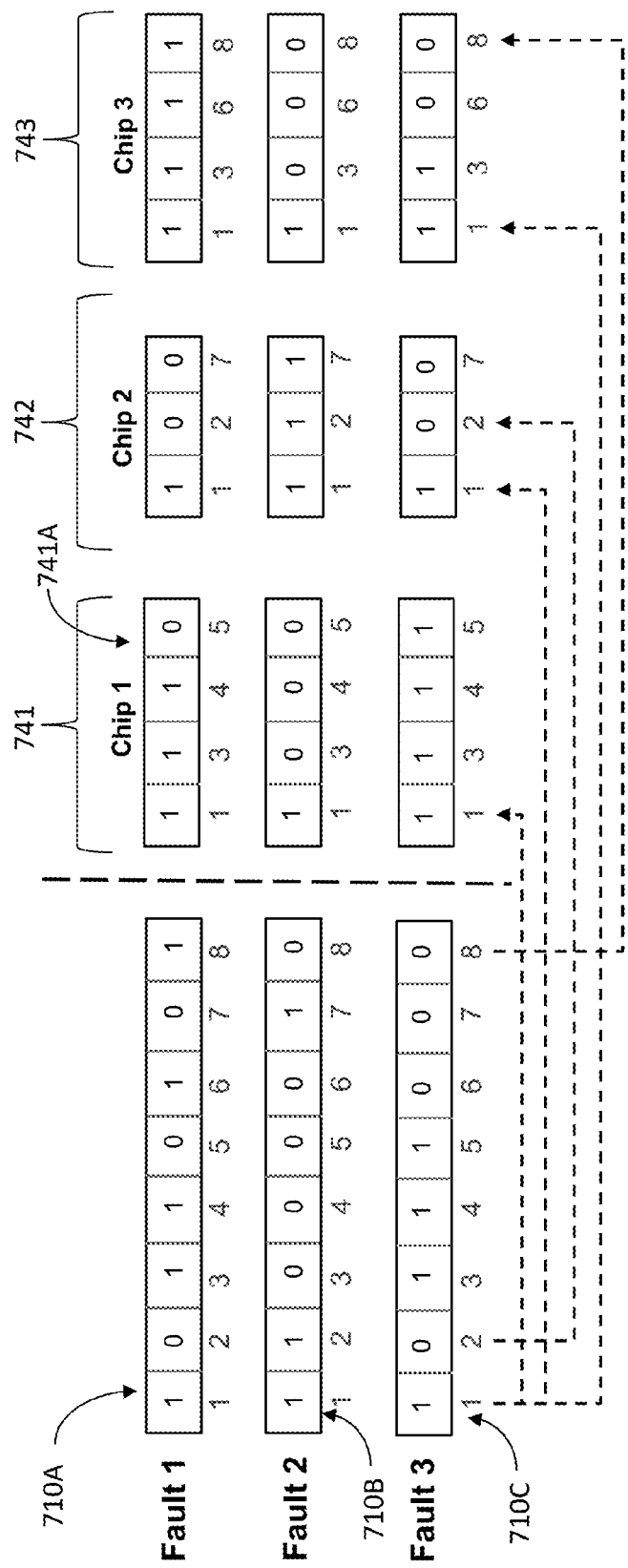
FIG. 7B is another illustrative diagram depicting a data arrangement and a method of processing said data.

FIG. 7B illustrates one process of extracting the individual failure detection information for each fault and for each failing chip instance. As an exemplary data representation, fault bit arrays 710A, 710B, and 710C are created as depicted in FIG. 7A to represent three faults.

Additional chip bit arrays 741, 742, and 743 may be created for each chip according to the failure data for each such chip. (Note that the chips used in the example of FIG. 7B do not have the same failure data as the chips depicted in the above tables.) For instance, if Chip 1 shows Failures 1, 3, 4, and 5, a corresponding chip bit array 741 has bit locations indexed as 1, 3, 4, and 5.

Specific instances of each chip bit array for each fault are then generated to contain the data from the indices for that fault bit array. For instance, a chip bit array 741A is generated with bit locations indexed 1, 3, 4, and 5, and populates each such bit location with the bit value in the same index in fault bit arrays 710A. That is, index 1 of 741A contains the bit value '1' from index 1 of 710A, index 3 of 741A contains the bit value '1' from index 3 of 710A, index 4 of 741A contains the bit value '1' from index 4 of 710A, and index 5 of 741A contains the bit value '0' from index 5 of 710A. Because not all bit values in 741A are '1,' it can be determined that Fault 1, represented by 710A, does not explain all failures in Chip 1.

Using the same process for the other faults and chips, it can be seen that Chip 1's failures in response to the input pattern are completely explained by Fault 3, Chip 2's are completely explained by Fault 2, and Chip 3's are completely explained by Fault 1.

The process as illustrated is expressed in the following algorithm:

[Algorithm 1]
1. For each failing Chip X:
   1.1. Retrieve List X of failure indices associated with Chip X.
   1.2. For each Fault Y detected during simulation:
      1.2.1. Retrieve Failure Bit Array Y for Fault Y.
      1.2.2. Create a Chip X-specific bit array for Fault Y (Array XY) of the length of List X, each index in Array XY labeled to an index in List X.
      1.2.3. For each Index I in List X:
         1.2.3.1. Get the Value V ("1" or "0") from Index I of Array X
         1.2.3.2. Set the value of Index I of Array XY to Value V.

Exemplary Methods of Detection and Diagnosis

Figure 3:
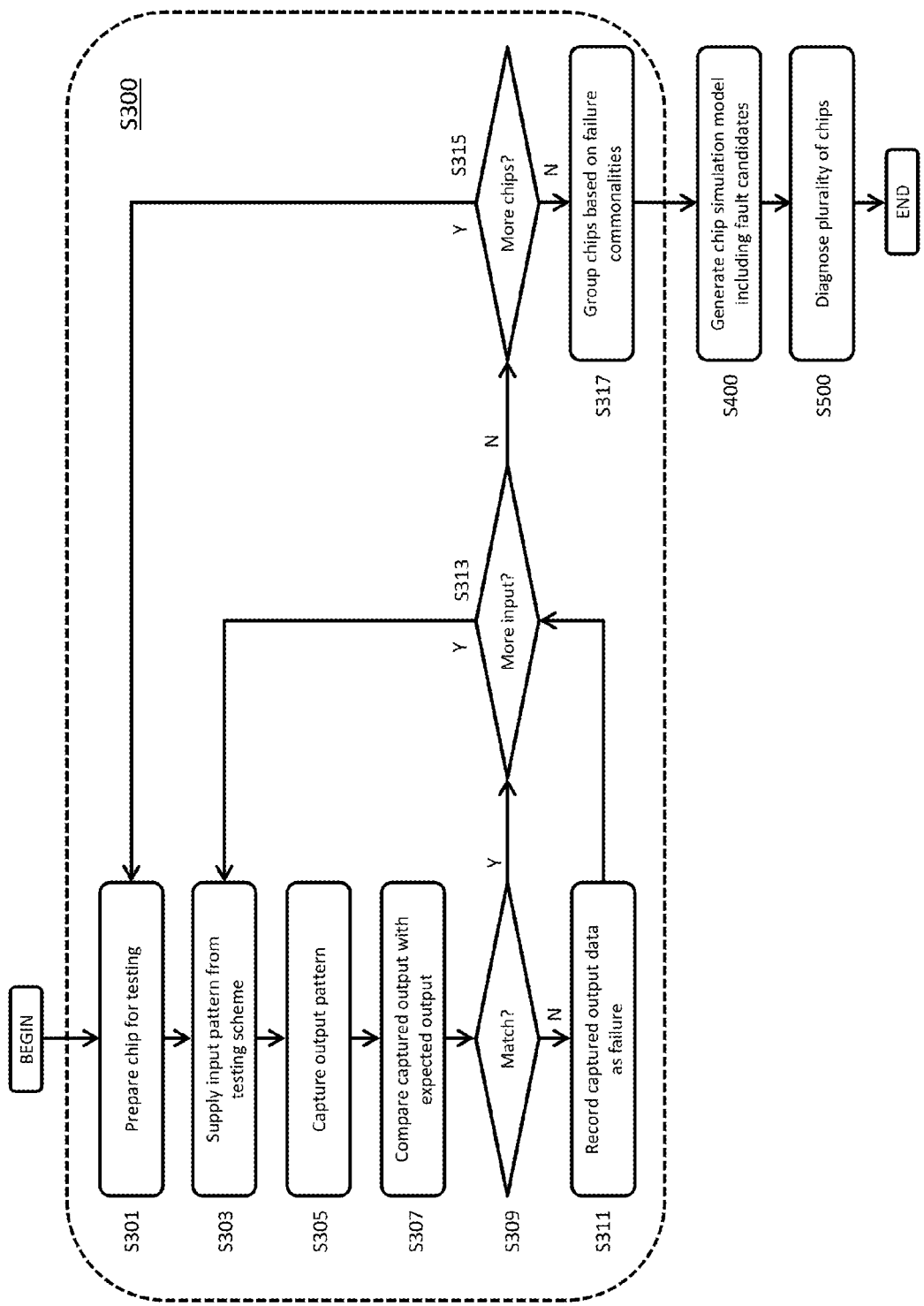
FIG. 3 is an illustrative flowchart depicting a method of detecting and diagnosing failures in a plurality of chips, with focus on a failure detection stage.

FIG. 3 is an illustrative flowchart depicting a method of detecting and diagnosing failures in a plurality of chips, with focus on a failure detection stage, implemented in accordance with one exemplary embodiment of the present invention.

At S300, a plurality of chips implementing a common chip design are put through failure detection. Then, at S400, a simulated chip model is generated using the detected failures and the common chip design; the model generation process may include determining one or more sets of fault candidates. Finally, at S500, the failures in the plurality of chips are diagnosed using the simulated chip model to determine the respective causes.

Focusing on S300, a chip is prepared for detection at S301; this may be done by placing it in communication with a device that can supply input and capture output, for instance by installing it in a chip receptacle. As part of a testing scheme which has been predetermined for the chip's design, using a method such as Automatic Test Pattern Generation, an input pattern $IP_i$ of one or more input signals is supplied to the chip at S303. The chip responds to $IP_i$ by producing an output pattern $CP_i$ of one or more output signals, which is captured at S305.

According to the testing scheme, $IP_i$ has a corresponding expected output pattern $EP_i$ of one or more expected output signals. At S307, the captured output pattern $CP_i$ is compared to the expected output pattern $EP_i$. Preferably, the comparison determines that the patterns match if each expected output in $EP_i$ is found to be a captured output in $CP_i$ and each captured output in $CP_i$ is found to be an expected output in $EP_i$; however, in some implementations and configurations, minor deviations may be considered within tolerance and will therefore still be considered a "match."

If $CP_i$ and $EP_i$ are determined to match at S309, it is checked at S313 whether the testing scheme has another input pattern $IP_{i+1}$, and if so, the flow returns to S303 to supply $IP_{i+1}$ to the chip. If there is no $IP_{i+1}$, it is checked at S315 whether there is another chip to test; if so, the flow returns to S301 to prepare the next chip, and if not, the flow proceeds to S317.

If $CP_i$ and $EP_i$ are determined not to match at S309, $CP_i$ is recorded as one or more failures in a data storage at S311. This recording operation may include the entire failed output pattern $CP_i$, grouped as a single failure, and may involve associating $CP_i$ with input pattern $IP_i$ and the source chip. Alternatively, the recording operation may extract the specific non-matching element or elements of $CP_i$ that do not match $EP_i$; that is, the recorded failures include the unexpected output or outputs but not the expected output or outputs. Preferably, each recorded failure includes exactly one unexpected output, and all unexpected outputs of all failed output patterns are so recorded. The operation may then associate each such unexpected output with a failed measure point, input pattern $IP_i$, and source chip. The recorded failure may also be indexed in a failure index for the chip, the entire test, or both. Upon completion of the recording, flow proceeds to S313 as before.

Optionally, at S317, the chips may be grouped efficiently based on failure commonality. That is, chips that share all or some failures may be grouped such that their sets of recorded failures are processed together in the later stages, which may further improve performance. The commonality may be identified using one or more data points used to represent or associate with a failure, such as input pattern, measure point, failing value, or it may be identified by the failed output pattern as a whole.

Once efficient grouping of chips is complete, the flow proceeds to S400 and S500 to generate the simulated chip model and diagnose the chips.

Figure 4:
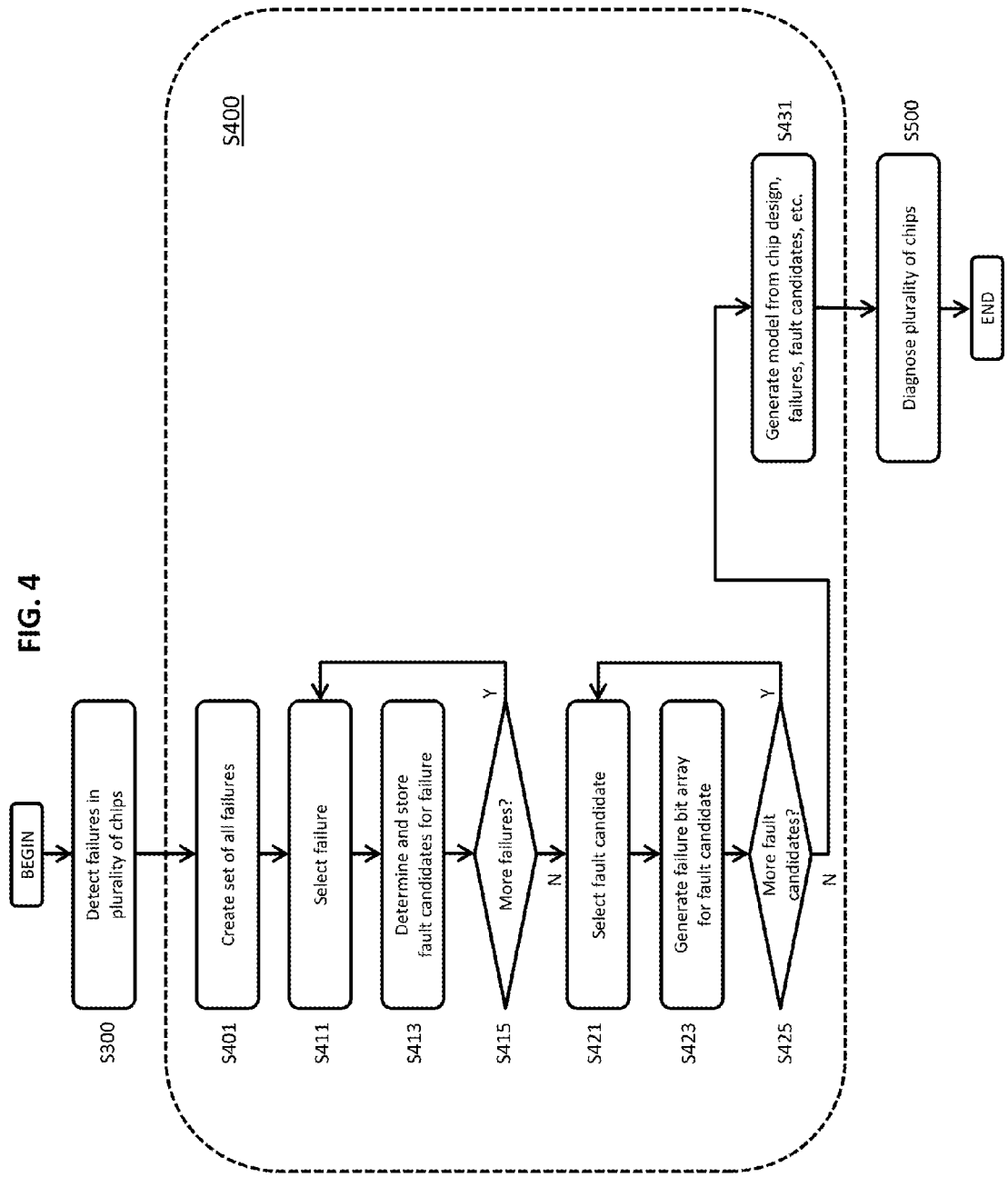
FIG. 4 is an illustrative flowchart depicting a method of detecting and diagnosing failures in a plurality of chips, with focus on a chip simulation model generation stage.

FIG. 4 is an illustrative flowchart depicting a method of detecting and diagnosing failures in a plurality of chips, with focus on a chip simulation model generation stage, implemented in accordance with one exemplary embodiment of the present invention. This embodiment may be selectively combined with the embodiment of FIG. 3.

Focusing on S400, at 5401 all individual failures detected during the detection stage S300 are combined into a merged failure set FS. If indexing of the individual failures did not occur in S300, said indexing also occurs at this point. Failures that are identical to another failure already in FS are duplicates; they do not receive their own index and are not added to FS. Identical failures may be identified using one or more data points used to represent or associate with a failure, such as input pattern, measure point, and failing value. Preferably, all three said data points are used, and a failure that does not match for all three said data points is not a duplicate.

As shown above, once failures are indexed, the indices may be used in a failure bit array in which a '1' for an index in the array indicates that the failure associated with that index is present. Some possible implementations of such arrays, making use of the indices in various ways, are depicted in FIGS. 7A and 7B.

At S411, a failure $F_i$ is selected from set FS. At S413, $F_i$ is examined to determine one or more fault candidates which, if present in a chip, would cause the $F_i$. All such fault candidates are added to a set of all fault candidates CS, with each fault candidate associated with $F_i$. If a fault candidate C is already in CS, it is not added again, but the association with $F_i$ is appended to any existing associations for C.

A common, although not required, fault candidate determination process is back cone tracing. In this method, the process traces the chip logic back from a failed measure point of a given failure. The traced area virtually seems like a cone and hence the process is generally termed as back cone tracing. Further description of back cone tracing is provided above.

At S415, if FS contains another failure $F_{i+1}$, the method returns to S411 to select it and repeat the process. If there is no $F_{i+1}$, then flow proceeds to S421.

At S421, a fault candidate $C_j$ is selected from set CS. A failure bit array $CA_j$ is then generated and stored at S423, wherein, if $C_j$ is associated with a failure $F_i$, index i in $CA_j$ stores a '1' bit, and otherwise stores a '0' bit. $CA_j$ thus represents all failures that it has been determined fault candidate $C_j$ could cause.

At S425, if CS contains another failure $C_{j+1}$, the method returns to S421 to select it and repeat the process. If there is no $C_{j+1}$, then flow proceeds to S431.

Although not depicted, it is noted that the process of S421, S423, and S425 may, with appropriate alteration which will be obvious to those of skill in the art, be used to generate a failure bit array for other elements, such as the chip failure bit arrays 741, 742, and 743 of FIG. 7B. Such a process may also part of the chip simulation model generation stage S400, or may be employed later during the failure diagnosis stage S500.

At S431, a simulated chip model is generated using one or more of the chip design, the input and/or output patterns, the fault candidates, and the failure bit arrays. Preferably, the model assumes the same chip design as the chips tested in S300, and that the chip being simulated suffers all the failures in set FS. Other data collected during or prior to the chip simulation model generation stage may also be used for the model. Measures for suitably generating such a model given this data and other information are known in the field and will not be elaborated on herein.

Figure 5:
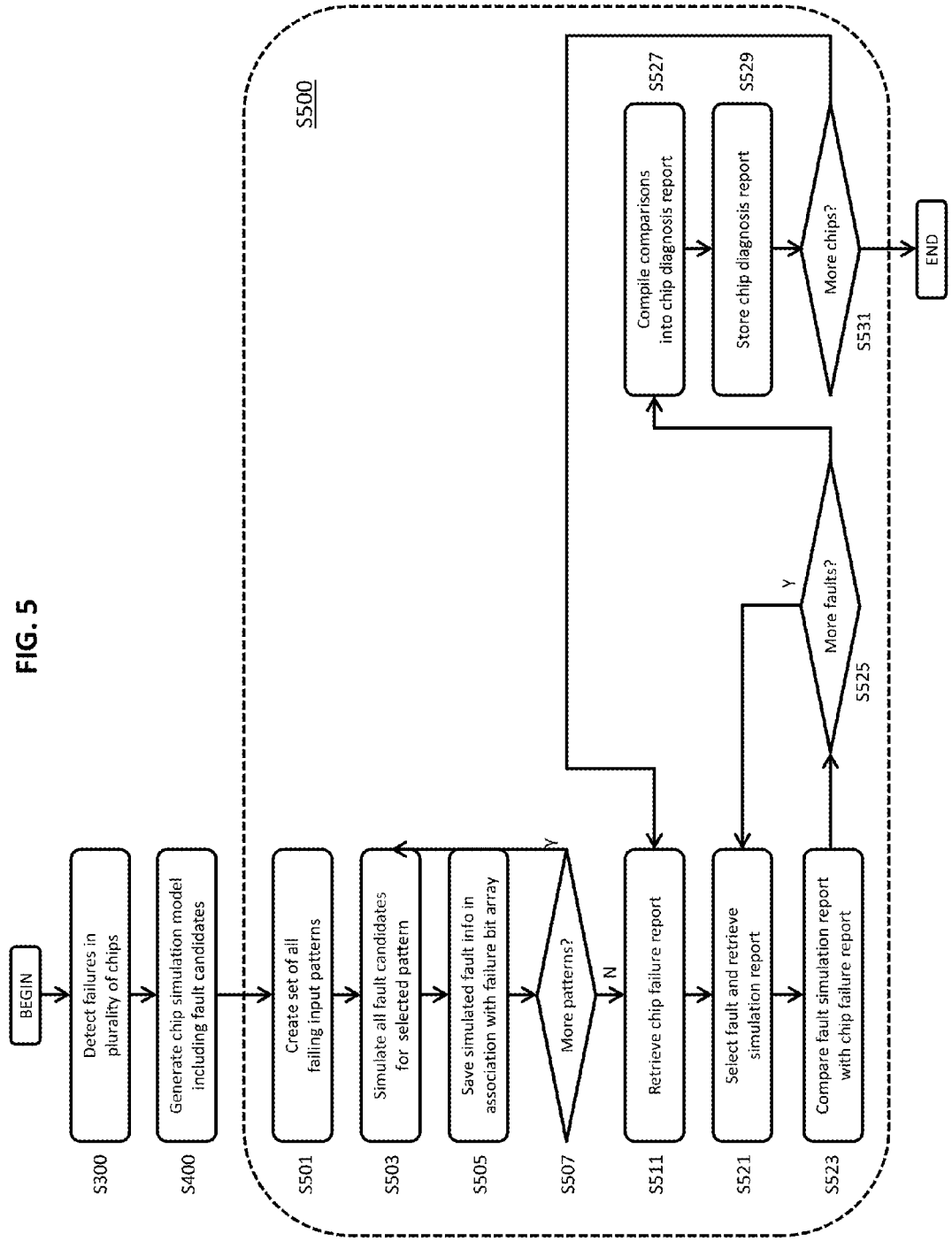
FIG. 5 is an illustrative flowchart depicting a method of detecting and diagnosing failures in a plurality of chips, with focus on a failure diagnosis stage.

FIG. 5 is an illustrative flowchart depicting a method of detecting and diagnosing failures in a plurality of chips, with focus on a failure diagnosis stage, implemented in accordance with one exemplary embodiment of the present invention. This embodiment may be selectively combined with the embodiments of FIGS. 3 and 4.

Focusing on S500, at 5501, all failing input patterns (that is, input patterns that are associated with one or more failures) are combined into a set IS. Optionally and if available, one or more passing input patterns (that is, input patterns that showed no failures for any chips) may also be selected for simulation and grouped into IS, and associated with all fault candidates. As a correct fault candidate will not produce any failure when simulated with a passing input pattern, testing these patterns will further increase diagnosis accuracy.

The fault simulation process then begins. At 5503, an input pattern $IP_i$ is selected from input pattern set IS, and a series of all fault candidates associated with $IP_i$ are simulated using $IP_i$ to determine what failures will result from said candidates. The fault candidates may be selected from set CS, if set CS was created in the chip simulation model generation stage S400.

At 5505, the resulting failures are recorded in a simulation report for each simulated fault candidate. That is, the simulation report will represent the output pattern $CP_i$ that results from input pattern $IP_i$ when the fault candidate is present. One possible representation of this simulation report may involve a bit array, such as shown in array 710 of FIG. 7A.

If more input patterns remain in IS at 5507, the flow returns to 5503 with $IP_{i+1}$. (Note that, if a fault candidate is tested again on $IP_{i+1}$ or other later input patterns in later iterations, the resulting simulation report may be merged with those for the same fault from earlier iterations.) Otherwise, the flow proceeds to 5511.

At 5511, a chip failure report for a chip is retrieved. This chip failure report identifies the chip and all failures associated with the chip. In some implementations, the report may identify the failures by storing all data on them, while in others it may simply provide pointers to the failure data stored elsewhere in a memory. One possible arrangement of the failure report may involve a bit array, such as shown in arrays 741, 742, and 743 of FIG. 7B. Chip failure reports may be generated individually as needed, or generated collectively at an earlier point, such as part of the chip grouping operation S317, or any time during the chip simulation model generation stage S400.

At 5521, a fault candidate $F_i$ is selected and its simulation report is retrieved. At S523, the simulation report is compared to the failure report for the chip, and it is determined how closely they match. Then, if an additional failure $F_{i+1}$ is present in the chip failure report at 5525, the flow returns to 5521 to load $F_{i+1}$; otherwise, the flow proceeds to S527.

At S527, a diagnosis report for the chip is compiled. This report may be limited to identifying faults for which the simulation report matched the chip failure report perfectly, or it may described the results of all comparisons from S523, to be reviewed at a later time. Other analysis may also occur at this point.

The report is stored in association with the chip at 5529. It is then checked at 5531 whether there is another chip to diagnose. If so, the method returns to 5511 to retrieve the chip failure report for the next chip, and if not, the method completes. The reports may be retrieved later for examination.

In some implementations, depending on the needs of the simulator and the details of the automated diagnosis process, the simulated chip model generated in S431 contains the chip design but does not represent the failures and/or fault candidates. Rather, sets FS and/or CS are kept separate in the data, and each failure and/or fault candidate is retrieved from this separate location at appropriate times in S500.

These and related processes, and other necessary instructions, may be encoded as executable instructions on one or more non-transitory computer readable media, such as hard disc drives or optical discs, and executed using one or more processors, in concert with an operating system or other suitable measures.

Figure 6:
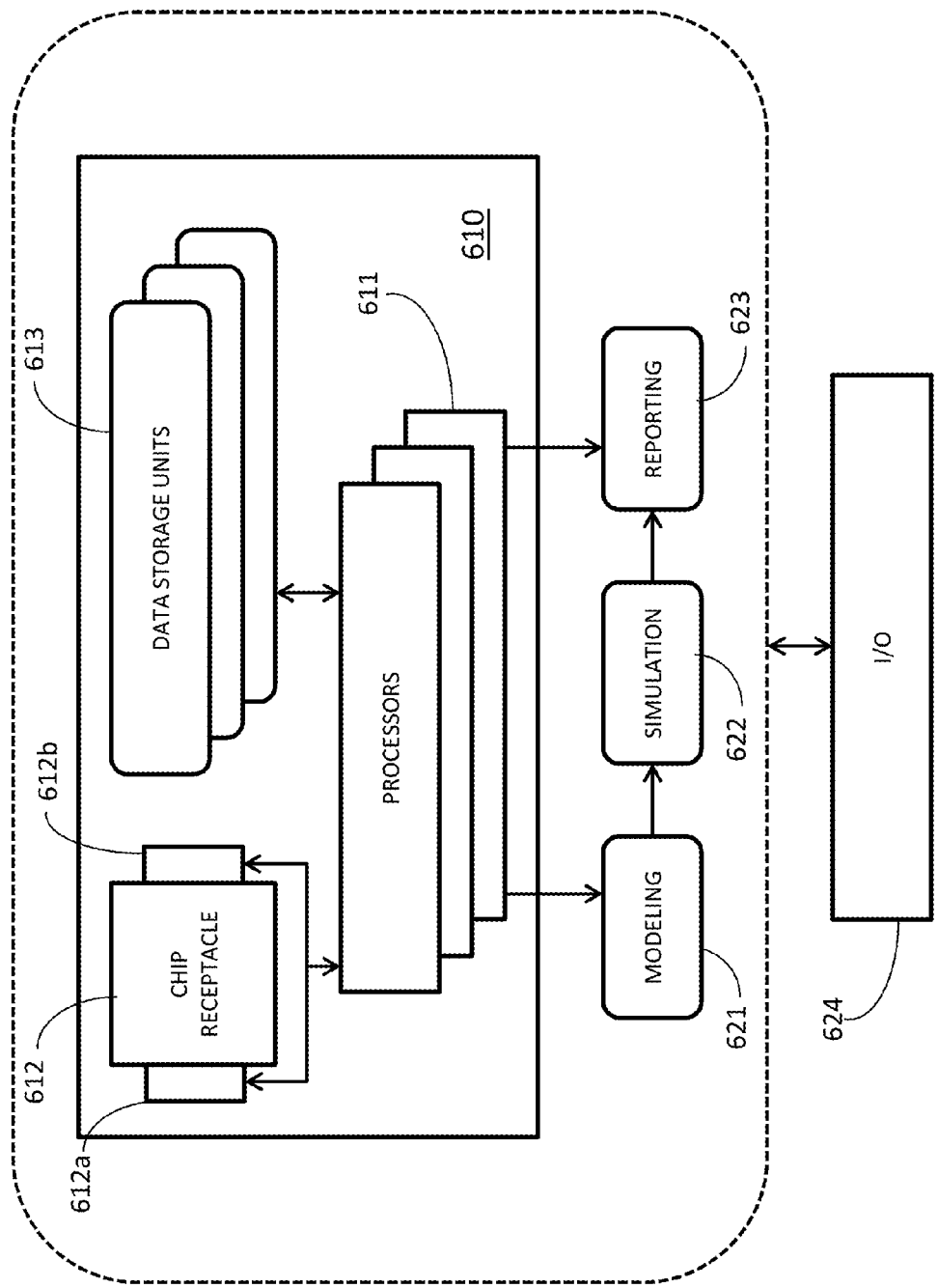
FIG. 6 is a block diagram depicting a system of for detecting and diagnosing failures in a plurality of chips.

FIG. 6 is a block diagram illustratively depicting a system for detecting and diagnosing failures in a plurality of chips, formed according to an exemplary embodiment of the present invention.

A chip failure detection device 610 in this illustrative implementation includes one or more processors 611 in communication with a chip receptacle 612 and one or more data storage units 613. A chip may be installed in the chip receptacle 612, which may provide input to and capture output from the chip. Specifically, the receptacle 612 may have one or more input connectors 612a which supply input to input points on the chip, and may also have one or more output connectors 612b which capture output from output points on the chip. The one or more processors 611 communicate with the chip receptacle 612, more specifically the input and output connectors 612a and 612b, to provide the input and receive the captured output.

A predetermined testing scheme, created using a method such as Automatic Test Pattern Generation, may be stored on the one or more data storage units 613; the one or more processors 611 may access this scheme to retrieve one or more input patterns which it will supply to the chip in the chip receptacle 612. Upon receiving the captured output pattern resulting from an input pattern, the one or more processors 611 may compare this output pattern to an expected output pattern, which it may determine from the predetermined testing scheme. If the captured output pattern and the expected output pattern fail to match, the one or more processors 611 may record the captured output pattern, or portions thereof, as a failure on the one or more data storage units 613, in association with the chip and the input pattern.

A chip modeling module 621 may be in communication with the chip failure detection device 610, and more specifically the one or more processors 611. The chip modeling module 621 may receive a chip design from the one or more processors 611, and may generate a simulated chip model from the chip design. The chip modeling module 621 may also receive information regarding one or more recorded failures, organized using methods such as those disclosed previously, from the one or more processors 611; the module may include this information in the resulting simulated chip model as well. The failures may in some implementations be organized by the one or more processors 611 into chip failure reports for failures originating from a specific chip, each of which will identify the source chip of all failures within; they may also be organized by the associated input patterns which trigger each failure.

A chip simulation module 622 may be in communication with the chip modeling module 621, and may receive the simulated chip model therefrom. If the simulated chip model does not incorporate the information regarding the one or more recorded failures, these may also be received from the chip modeling module 621. Although not so depicted, in some implementations the chip simulation module 622 may also be in direct communication with the one or more processors 611, and the failure information may be received therefrom, instead of from the chip modeling module 621.

The chip simulation module 622 may analyze the simulated chip model in light of the failure information, and for each failure determine one or more fault candidates which could cause the failure, for instance through a back cone trace process. (In some instances, it might not be possible to determine a fault candidate, and data stating so will be provided instead. For the purposes of this description, this data will be treated as another determined fault candidate, as with rare exception it will be organized and treated in the same manner.) These determined fault candidates may each be associated with the failure which they cause. In some implementations, the determined fault candidates are instead determined by the chip modeling module 621 and are included in the simulated chip model.

The chip simulation module 622 also simulates each fault candidate in the simulated chip model and determine the failures that would result from each fault candidate. These results may be compiled into a fault simulation report.

A chip reporting module 623 may be in communication with the chip simulation module 622, and may receive the set of fault simulation reports.

The chip reporting module 623 may also be in direct communication with the one or more processors 611, and may receive one or more chip failure reports therefrom. Although not so depicted, in other implementations, the chip reporting module 623 may alternatively be in direct communication with the chip modeling module 621, and the chip failure reports may be received therefrom, instead of from the one or more processors 611.

The chip reporting module 623 compares each chip failure report to each fault simulation report. The chip reporting module 623 then outputs a chip diagnosis report, the report describing the results of said comparisons including at least all perfect matches.

Although not so depicted, the chip modeling module 621 and the chip simulation module 622 may be organized as a single module in some implementations. Likewise, the chip simulation module 622 and the chip reporting module 623 may be organized as a single module in some implementations.

A variation (not depicted) on the system of FIG. 6 may implement one, two, or all three modules 621, 622, and 623 as software stored on one or more of the data storage units 613 and executed on one or more of the processors 611.

An input/output (I/O) component 630 may collectively communicate with other components in the system, including but not limited to the one or more processors 611 and one or more of the modules 621, 622, and 623. In particular, the I/O 630 may instruct the one or more processors 611 to provide input to and capture output from a chip in the chip receptacle 612, may instruct the one or more processors 611 to send the chip design, failures information, and/or other data to one of the modules 621, 622, or 623, and may receive the chip diagnosis report from the chip reporting module 623.

In an illustrative software implementation, the software includes a plurality of computer executable instructions, to be implemented on a computer system. Prior to loading in a computer system, the software may reside as encoded information on a computer-readable non-transitory medium, such as a magnetic floppy disk, a magnetic tape, CD-ROM, DVD-ROM, or any other suitable medium. The modules and other necessary software may be executed on the same processor or processors, but may also be executed on separate processors in communication with each other, which need not be in physical proximity to each other.

In an illustrative hardware implementation, the invention may comprise a dedicated processor or processing portions of a system on chip (SOC), portions of a field programmable gate array (FPGA), or other such suitable measures, executing processor instructions for performing the functions described herein or emulating certain structures defined herein. Suitable circuits using, for example, discrete logic gates such as in an Application Specific Integrated Circuit (ASIC), Programmable Logic Array (PLA), or Field Programmable Gate Arrays (FPGA) may also be developed to perform these functions.

Advantages of the Preferred Systems and Methods

Using the disclosed systems and methods, the diagnosis stage of a manufacturing test may reduce redundancy, both by initializing the simulation module only once, and by back-tracing each variety of failure only once. The result is considerably faster and more efficient than existing serial diagnosis methods. In a comparison, tests of manufacturing runs using the collective diagnosis (CD) process disclosed above have completed ten to twenty times faster than tests using serial diagnosis (SD) processes, as can be seen in the following analysis:

TABLE 7

| Chip Design | Design Size | Chips | Run Time (SD) | Avg. Memory Usage (SD) | Run Time (CD) | Avg. Memory Usage (CD) | Run Time Improvement For CD |
|---|---|---|---|---|---|---|---|
| A | 130M | 172 | 3018 min | 28 GB | 204 min | 47 GB | 14.79x |
| B | 70M | 200 | 1327 min | 11 GB | 68 min | 16 GB | 19.51x |

The improvement in time varies depending on factors such as the number of chips in the manufacturing run, the complexity of the chip design, and the number of shared failures or faults among the chips. In practice, the number of shared failures or faults for a complex design might be relatively low. However, it is noted that even in the case of no shared failures or faults, the disclosed process avoids repeating the fixed cost of the initialization process and therefore saves at least $T_I^* (C-1)$, where $T_I$ is the simulation initialization time and C is the number of chips combined into the simulated chip. For complex chip designs, $T_I$ may be two minutes or more, and therefore a manufacturing test of such a design will see, at minimum, a time savings of over three hours per hundred chips. As typical chip complexity can be expected to rise with simulation processing speed, the time savings will remain non-trivial for the foreseeable future.

The descriptions above are intended to illustrate possible implementations of the disclosed system and method, and are not restrictive. While this disclosure has been made in connection with specific forms and embodiments thereof, it will be appreciated that various modifications other than those discussed above may be resorted to without departing from the spirit or scope of the disclosed system and method. Such variations, modifications, and alternatives will become apparent to the skilled artisan upon a review of the disclosure. For example, functionally equivalent elements or method steps may be substituted for the specifically shown and described, and certain features may be used independently of other features, and all or some of the above embodiments may be selectively combined with each other, and in certain cases, particular locations of elements or sequence of method steps may be reversed or interposed, all without departing from the spirit or scope of the disclosed system and method as defined in the appended claims. The scope should therefore be determined with reference to the description above and the appended claims, along with their full range of equivalents.

What is claimed is:

1. A method of detecting and diagnosing failures and faults in a plurality of chips implementing a common design, the method comprising:
   for each chip in the plurality of chips:
      receiving, by a chip failure detection device, one or more input patterns of one or more inputs predetermined under a testing scheme predetermined for the common design of the plurality of chips, the testing scheme including an expected output pattern of one or more expected outputs for each input pattern,
      for each supplied input pattern, capturing a resulting output pattern and comparing the resulting output pattern with the expected output pattern, and
      for each resulting output pattern that does not match the expected output pattern, recording one or more real failures, each real failure representing at least one unexpected output of the resulting output pattern and recorded in association with the chip and the input pattern;

generating, in a chip modeling module, a simulated chip model having the common design of the plurality of chips;

running, in a chip simulation module using the simulated chip model, a simulation, in which the one or more input patterns are applied in the simulation to each of a plurality of simulated faults, and each simulated unexpected output pattern resulting from a simulated input pattern and a simulated fault is recorded as one or more simulated failures, each simulated failure representing at least one unexpected output of the simulated unexpected output pattern and recorded in association with the simulated input pattern and the simulated fault;

for each simulated fault, compiling a simulation report including all simulated failures associated with the simulated fault; and for each chip in the plurality of chips,
compiling a chip failure report including all real failures associated with the chip,
for each simulated fault, comparing the real failures of the chip failure report to the simulated failures of the simulation report of the simulated fault, and
generating a chip diagnosis report including at least one result of the comparison.

2. The method of claim 1, wherein at least one of the one or more input patterns applied in the simulation is a supplied input pattern for which the resulting output pattern matched the expected output pattern for all chips in the plurality of chips.

3. The method of claim 1, wherein each chip diagnosis report includes all simulated faults for which a set of all simulated failures of the simulation report of the simulated fault matches a set of all real failures of the chip failure report.

4. The method of claim 1, wherein each chip diagnosis report includes all simulated faults for which a set of all simulated failures of the simulation report of the simulated fault form a subset of a set of all real failures of the chip failure report.

5. The method of claim 1, further comprising, before generating the simulated chip model, organizing the plurality of chips into one or more groups of chips, each chip group formed based on a commonality of failures.

6. The method of claim 1,
wherein each real failure represents exactly one unexpected output of the resulting output pattern, and all unexpected outputs of each non-matching resulting output pattern are so recorded, and
wherein each simulated failure represents exactly one simulated unexpected output, and all simulated unexpected outputs are so recorded.

7. The method of claim 1, wherein each of the plurality of simulated faults are determined by conducting a back cone trace according to one of the unexpected outputs of the one or more recorded real failures.

8. The method of claim 1,
wherein, for each resulting output pattern that does not match the expected output pattern, one real failure is recorded for each unexpected output of the resulting output pattern, and
wherein each real or simulated failure associated with a combination of measure point and input pattern which is unique among all real or simulated failures is assigned a unique failure index.

9. The method of claim 8,
wherein a data representation of the simulation report includes an array of failure bits, each failure bit having a bit index, each failure bit set to a bit value of 1 if and only if the simulated failure having the failure index corresponding to the bit index of the failure bit is associated with the simulated fault.

10. A non-transitory computer readable medium encoded with executable processing instructions for implementing the method of claim 1 using one or more processors.

11. A failure diagnosis system for chips, the system comprising:
a chip failure detection device including a chip receptacle, one or more processors, and one or more data storage units, the chip receptacle having input and output connectors, the one or more processors configured to:
supply one or more input patterns of one or more inputs through the input connector to a chip installed in the chip receptacle, the one or more input patterns predetermined under a testing scheme for the chip design of the chip, the testing scheme including an expected output pattern of one or more outputs for each input pattern, the testing scheme stored in one of the one or more data storage units,
for each supplied input pattern, capture a resulting output pattern from the output connector of the chip receptacle and compare it with the expected output pattern, and
for each resulting output pattern that does not match the expected output pattern, recording one or more real failures to one of the one or more data storage units, each real failure representing at least one unexpected output of the resulting output pattern and recorded in association with the chip and the input pattern,
a chip modeling module configured to generate a simulated chip model having a predetermined chip design;
a chip simulation module configured to:
receive, from the chip modeling module, the simulated chip model,
run a simulation, using the simulated chip model, in which one or more input patterns are applied in the simulation to each of a plurality of simulated faults, and
record each simulated unexpected output resulting from a simulated input pattern and a simulated fault as a simulated failure, in association with the simulated input pattern and the simulated fault,
a chip reporting module configured to:
receive, from the chip simulation module, the set of recorded simulated failures,
receive one or more chip failure reports, each chip failure report identifying a chip presently or previously installed in the chip receptacle, and a set of failures associated with said chip,
for each simulated fault, comparing the real failures of the chip failure report to the simulated failures of the simulation report of the simulated fault, and
generate a chip diagnosis report including at least one result of the comparison.

12. The system of claim 11,
wherein the chip failure report is compiled by the one or more processors and includes all real failures associated with the chip identified in the chip failure report, and
the chip reporting module receives the one or more chip failure reports from the chip fault detection device.

13. The system of claim 11,
wherein the chip failure report is compiled by the one or more processors and includes all real failures associated with the chip identified in the chip failure report,
the chip modeling module receives the one or more chip failure reports from the chip fault detection device, and the chip reporting module receives the one or more chip failure reports from the chip fault detection device.

14. The system of claim 11, wherein each of the plurality of simulated faults are determined by the chip modeling module conducting a back cone trace according to one of the recorded real failures.

15. The system of claim 11, wherein each of the plurality of simulated faults are determined by the chip simulation module conducting a back cone trace according to one of the recorded real failures.

16. The system of claim 11, wherein the chip modeling module, the chip simulation module, and the chip reporting module are encoded as software on the data storage units and executed on the one or more processors.

* * * * *